United States Patent
Bui et al.

(10) Patent No.: US 9,608,670 B2
(45) Date of Patent: Mar. 28, 2017

(54) RELIABLE DATA READING WITH DATA SET SCREENING BY ERROR INJECTION

(71) Applicant: International Business Machines Corporation, Armonk, NY (US)

(72) Inventors: Nhan X. Bui, Tucson, AZ (US); Setsuko Masuda, Tokyo (JP); Keisuke Tanaka, Tokyo (JP); Kazuhiro Tsuruta, Kanagawa (JP)

(73) Assignee: International Business Machines Corporation, Armonk, NY (US)

( * ) Notice: Subject to any disclaimer, the term of this patent is extended or adjusted under 35 U.S.C. 154(b) by 234 days.

(21) Appl. No.: 14/331,184

(22) Filed: Jul. 14, 2014

(65) Prior Publication Data

US 2016/0013807 A1    Jan. 14, 2016

(51) Int. Cl.
*H03M 13/00* (2006.01)
*H03M 13/37* (2006.01)
(Continued)

(52) U.S. Cl.
CPC ........... *H03M 13/373* (2013.01); *G11B 5/008* (2013.01); *G11B 20/1833* (2013.01);
(Continued)

(58) Field of Classification Search
CPC ...... H03M 13/43; H03M 13/15; H03M 13/19; H03M 7/46; G06F 3/0671;
(Continued)

(56) References Cited

U.S. PATENT DOCUMENTS 4,791,643 A * 12/1988 Molstad ............. G11B 20/1809
    714/762
5,309,299 A *  5/1994 Crossland ................ G11B 5/58
    360/77.01
(Continued)

FOREIGN PATENT DOCUMENTS

FR    2910144    6/2008
GB    2346285    8/2000
WO   WO2007102434   9/2007

OTHER PUBLICATIONS

Harvey et al., "Defect detection from scratched 2 in. quadruplex video tape," Journal of Electronic Imaging, vol. 9, No. 2, Apr. 2000, pp. 203-216.

(Continued)

*Primary Examiner* — Albert Decady
*Assistant Examiner* — Osman M Alshack
(74) *Attorney, Agent, or Firm* — Zilka-Kotab, PC

(57) ABSTRACT

According to one embodiment, a method for processing data includes determining whether a PES is invalid while reading data from a magnetic medium using at least one data channel, determining whether a PES value is above a first predetermined threshold when the PES is valid, injecting error bits into a data stream in place of corresponding bits of decoded data when the PES is invalid and/or the PES value is above the first predetermined threshold, decoding the data using a run-length limited (RLL) decoder to produce the decoded data based on the data from the magnetic medium, and outputting the data stream. Other methods, systems, and tape drives for processing data using error injection are described in more embodiments.

19 Claims, 7 Drawing Sheets

(51) Int. Cl.
*H03M 13/43* (2006.01)
*H03M 13/15* (2006.01)
*G11B 5/008* (2006.01)
*G11B 20/18* (2006.01)
*H03M 13/19* (2006.01)
*G06F 13/16* (2006.01)
*G06F 3/06* (2006.01)

(52) U.S. Cl.
CPC ............ *H03M 13/15* (2013.01); *H03M 13/43* (2013.01); *G06F 3/0671* (2013.01); *G06F 13/16* (2013.01); *G06F 2003/0698* (2013.01); *H03M 13/19* (2013.01)

(58) Field of Classification Search
CPC ....... G06F 2003/0698; G06F 2212/213; G11B 5/008; G11B 5/0083; G01R 13/16
USPC .................................................. 714/760, 755
See application file for complete search history.

(56) References Cited

U.S. PATENT DOCUMENTS

| | | | | |
|---|---|---|---|---|
| 5,737,142 A * | 4/1998 | Zook | ................... | G11B 5/5526 341/59 |
| 5,999,110 A * | 12/1999 | Blaum | ................ | G11B 20/1403 341/59 |
| 6,243,225 B1 * | 6/2001 | Wyman | .................. | G11B 5/584 360/77.12 |
| 6,690,535 B2 * | 2/2004 | Wang | ................... | G11B 5/5922 360/25 |
| 8,037,346 B2 | 10/2011 | Katagiri et al. | | |
| 8,495,734 B2 | 7/2013 | Bancel et al. | | |
| 2003/0048570 A1 * | 3/2003 | Galloway | ........... | G11B 5/59605 360/78.06 |
| 2004/0212915 A1 * | 10/2004 | Chliwnyj | ................ | G11B 27/36 360/77.12 |
| 2005/0071724 A1 * | 3/2005 | Blacquiere | ............. | H04N 19/89 714/755 |
| 2008/0212433 A1 | 9/2008 | El Husseini et al. | | |
| 2008/0294954 A1 | 11/2008 | Katagiri et al. | | |
| 2009/0002859 A1 * | 1/2009 | Johnson | ................. | G11B 5/584 360/13 |
| 2009/0254782 A1 | 10/2009 | Bancel et al. | | |
| 2009/0296269 A1 * | 12/2009 | Fujita | ..................... | G11B 5/584 360/77.12 |
| 2010/0332919 A1 | 12/2010 | Ito et al. | | |
| 2011/0141602 A1 | 6/2011 | Leopold, Jr. et al. | | |
| 2011/0276859 A1 | 11/2011 | Baba | | |
| 2013/0185596 A1 | 7/2013 | Masser et al. | | |
| 2014/0118856 A1 * | 5/2014 | Underkofler | ......... | G11B 15/602 360/71 |

OTHER PUBLICATIONS

Hillyer et al., "On the Modeling and Performance Characteristics of a Serpentine Tape Drive," SIGMETRICS '96, 1996 ACM, pp. 170-179.

Christmansson et al., "Error Injection Aimed at Fault Removal in Fault Tolerance Mechanisms—Criteria for Error Selection using Field Data on Software Faults," 1996 IEEE, pp. 175-184.

\* cited by examiner

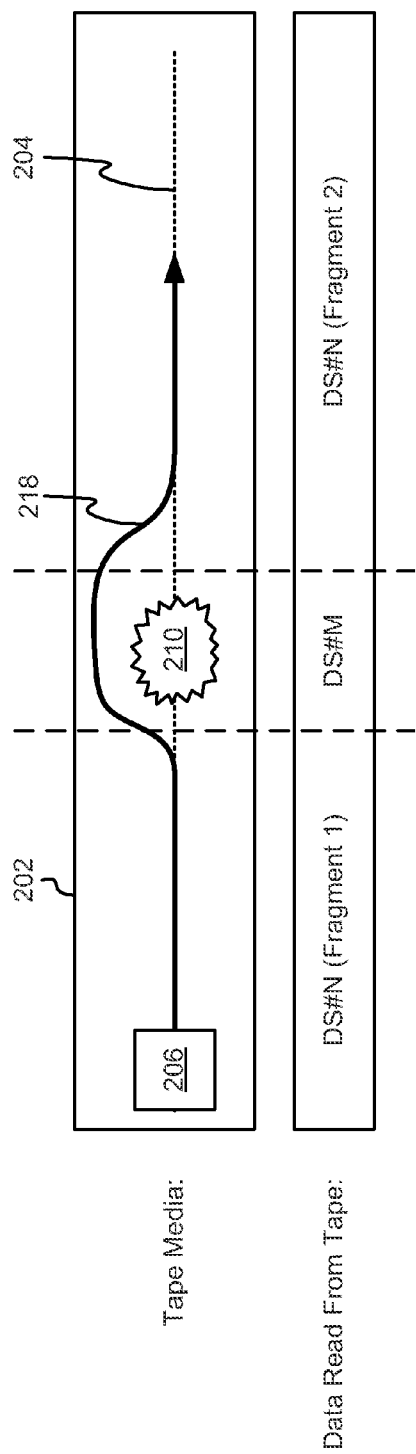
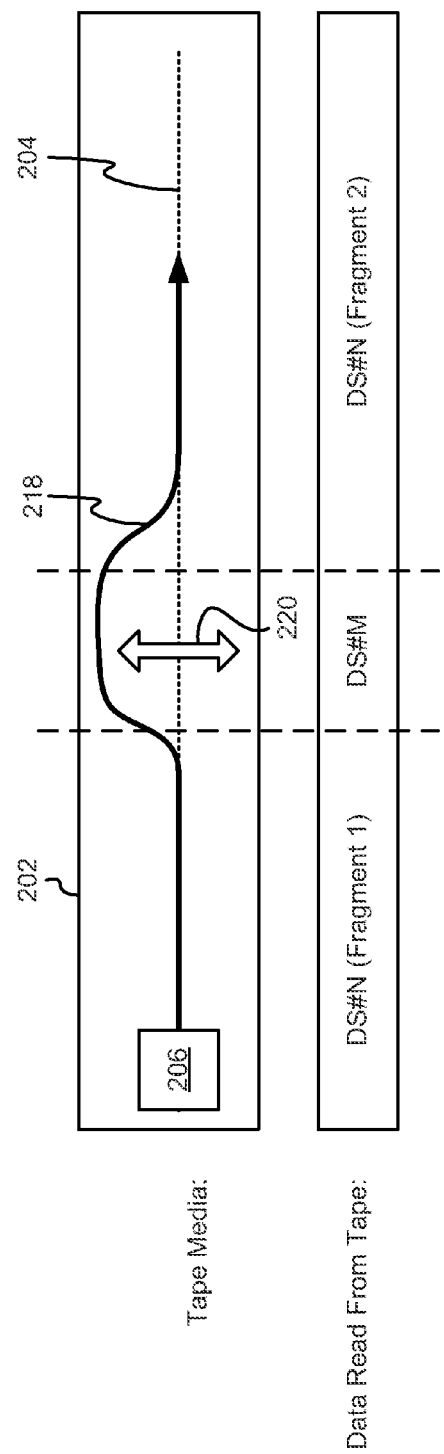

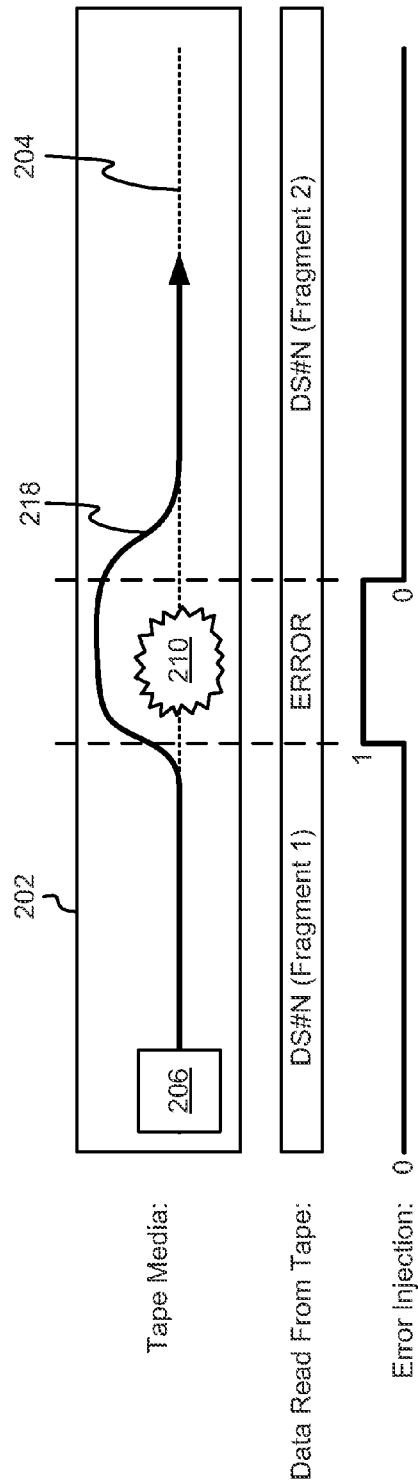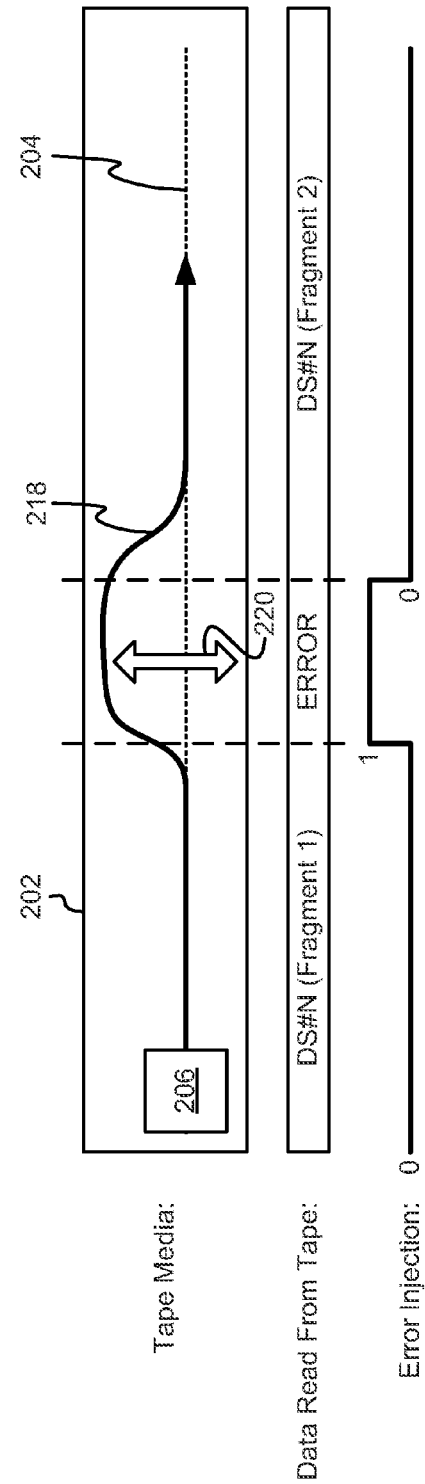

RELIABLE DATA READING WITH DATA SET SCREENING BY ERROR INJECTION

BACKGROUND

The present invention relates to data storage, and more particularly, to reliable data reading with data set screening by error injection using a data channel in a magnetic tape drive.

With a linear tape storage system, it is important to keep magnetic data heads aligned with target data tracks while reading data from tape media. A track-following servo system is usually engaged with controlling the magnetic head position using a position error signal (PES) which is derived from positional relativity between the pre written servo pattern on the magnetic media and magnetic head position. In order to follow the servo track, a valid PES must be detected. However, tape media typically have some amount of defects and scratches of varying sizes, particularly after being in use for any significant amount of time. Detecting an invalid PES causes loss of magnetic head position control in a feedback loop and eventually data readers will become located outside of target data tracks.

On the other hand, magnetic heads may be knocked off track while in operation due to a mechanical disturbance, vibration, and/or shock event. Any of these disturbances has the potential to push magnetic head position off of the target tracks.

In either case, off-track reading causes increases in read errors which must be responded to by the tape drive. To ensure data integrity, the tape drive adds error correction code (ECC) to original data while writing the data onto tracks of the tape media. The ECC and associated data is then decoded for reconstruction of the original data during a read operation. The ECC contributes to more successful data recovery in case the original data is damaged due to media defect or some other disturbance. It also helps to compensate for off-track reading, but its effectiveness depends on the severity of the off-track reading.

BRIEF SUMMARY

According to one embodiment, a system for processing data includes a controller configured to determine whether a position error signal (PES) is invalid while reading data from a magnetic medium using at least one data channel, determine whether a PES value is above a first predetermined threshold when the PES is valid, and inject error bits into a data stream in place of corresponding bits of decoded data when the PES is invalid and/or the PES value is above the first predetermined threshold.

In another embodiment, a magnetic tape drive includes a controller configured to read data from a magnetic medium using at least one data channel, receive a PES and a PES value from a servo channel, determine whether the PES is invalid while reading, the data, determine whether the PES value is above a first predetermined threshold when the PES is valid, and inject error bits into a data stream in place of corresponding bits of decoded data when the PES is invalid and/or the PES value is above the first predetermined threshold.

According to another embodiment, a method for processing data includes determining whether a PES is invalid while reading data from a magnetic medium using at least one data channel, determining whether a PES value is above a first predetermined threshold when the PES is valid, injecting error bits into a data stream in place of corresponding bits of decoded data when the PES is invalid and/or the PES value is above the first predetermined threshold, decoding the data using a run-length limited (RLL) decoder to produce the decoded data based on the data from the magnetic medium, and outputting the data stream. Other aspects and embodiments of the present invention will become apparent from the following detailed description, which, when taken in conjunction with the drawings, illustrates by way of example the principles of the invention.

BRIEF DESCRIPTION OF THE SEVERAL VIEWS OF THE DRAWINGS

FIG. 3A shows an exemplary tape read situation.

FIG. 3B shows another exemplary tape read situation.

FIG. 4A shows a tape read situation and solution, according to one embodiment.

FIG. 4B shows a tape read situation and solution, according to one embodiment.

DETAILED DESCRIPTION

Figure 1A:
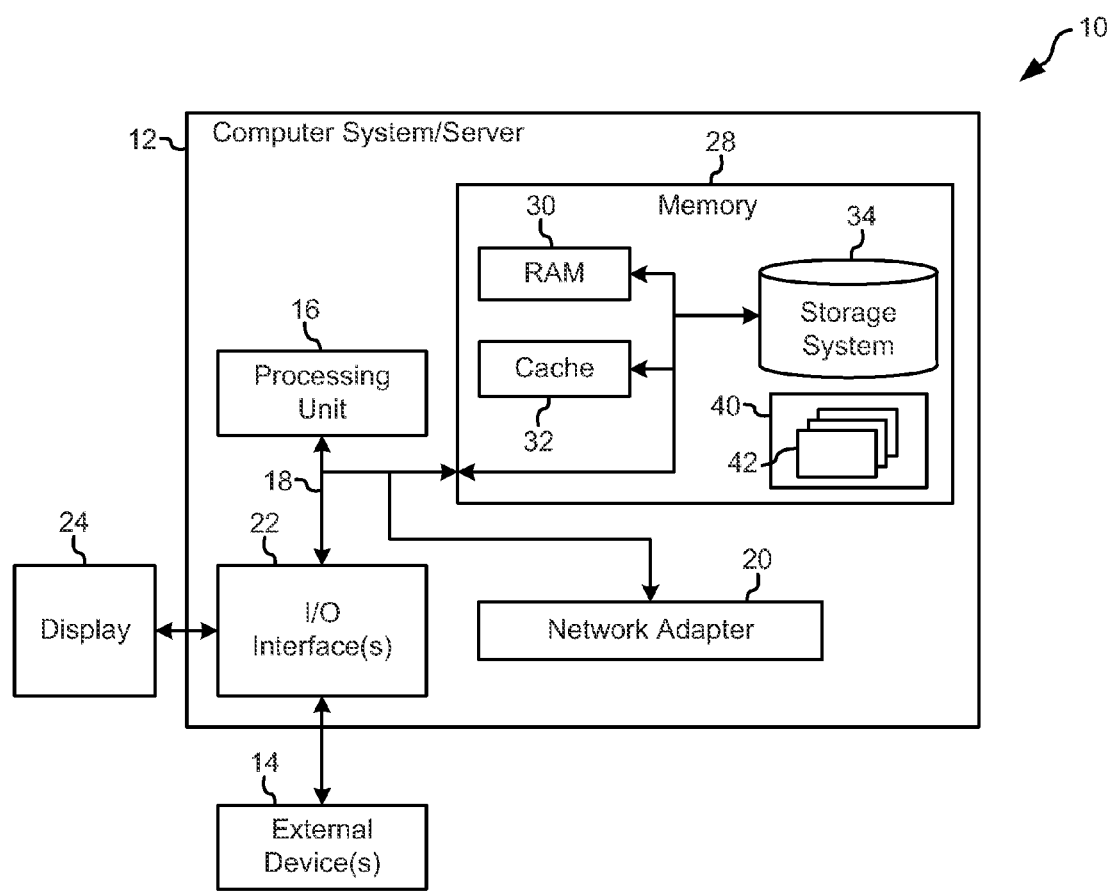
FIG. 1A illustrates a network storage system, according to one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc. It must also be noted that, as used in the specification and the appended claims, the singular forms "a," "an," and "the" include plural referents unless otherwise specified.

In one embodiment, data may be read from magnetic media in a manner which avoids off-track reading and skips media defect areas while screening data sets. This is accomplished, in one approach, by monitoring a position error signal (PES) value and a status of the PES (either valid or invalid). When screening the data set; an error data stream is injected in portions of the data stream as a replacement for the actual data therein at an error correction code (ECC) decoder input in case the PES valid status and PES value indicate that a magnetic head used to read the data is not on a target track. This approach allows for non-stop ECC decoding processing and maximizes usage of error correction once the magnetic head position is back on the target track. For insurance of data integrity, in one embodiment, data may be masked out on both off-track reading areas and media defect areas.

According to one general embodiment, a system for processing data includes a controller configured to determine whether a PES is invalid while reading data from a magnetic medium using at least one data channel, determine whether a PES value is above a first predetermined threshold when the PES is valid, and inject error bits into a data stream in place of corresponding bits of decoded data when the PES is invalid and/or the PES value is above the first predetermined threshold.

In another general embodiment, a magnetic tape drive includes a controller configured to read data from a magnetic medium using at least one data channel, receive a PES and a PES value from a servo channel, determine whether the PES is invalid while reading the data, determine whether the PES value is above a first predetermined threshold when the PES is valid, and inject error bits into a data stream in place of corresponding bits of decoded data when the PES is invalid and/or the PES value is above the first predetermined threshold.

According to another general embodiment, a method for processing data includes determining whether a PES is invalid while reading data from a magnetic medium using at least one data channel, determining whether a PES value is above a first predetermined threshold when the PES is valid, injecting error bits into a data stream in place of corresponding bits of decoded data when the PES is invalid and/or the PES value is above the first predetermined threshold, decoding the data using a run-length limited (RLL) decoder to produce the decoded data based on the data from the magnetic medium, and outputting the data stream.

Referring now to FIG. 1A, a schematic of a network storage system 10 is shown according to one embodiment. This network storage system 10 is only one example of a suitable storage system and is not intended to suggest any limitation as to the scope of use or functionality of embodiments of the invention described herein. Regardless, network storage system 10 is capable of being implemented and/or performing any of the functionality set forth hereinabove.

In the network storage system 10, there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the genera context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 1A, computer system/server 12 in the network storage system 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12 typically includes a variety of computer system readable media. Such media may be any available media that is accessible by computer system/server 12, and it includes both volatile and non-volatile media, removable and non-removable media.

System memory 28 may include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 may be provided for reading from and writing to a non-removable, non-volatile magnetic media—not shown and typically called a "hard disk," which may be operated in a HDD. Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media may be provided. In such instances, each may be connected to bus 18 by one or more data media interfaces. As will be further depicted and described below, memory 28 may include at least one program product having a set (e.g., at least one) of program modules that are configured to carry out the functions of embodiments described herein.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof may include an implementation of a networking environment. Program modules 42 generally carry out the functions and/or methodologies of embodiments of the invention as described her.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication may occur via Input/Output (I/O) interfaces 22. Still yet, computer system/server 12 may communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

Figure 1B:
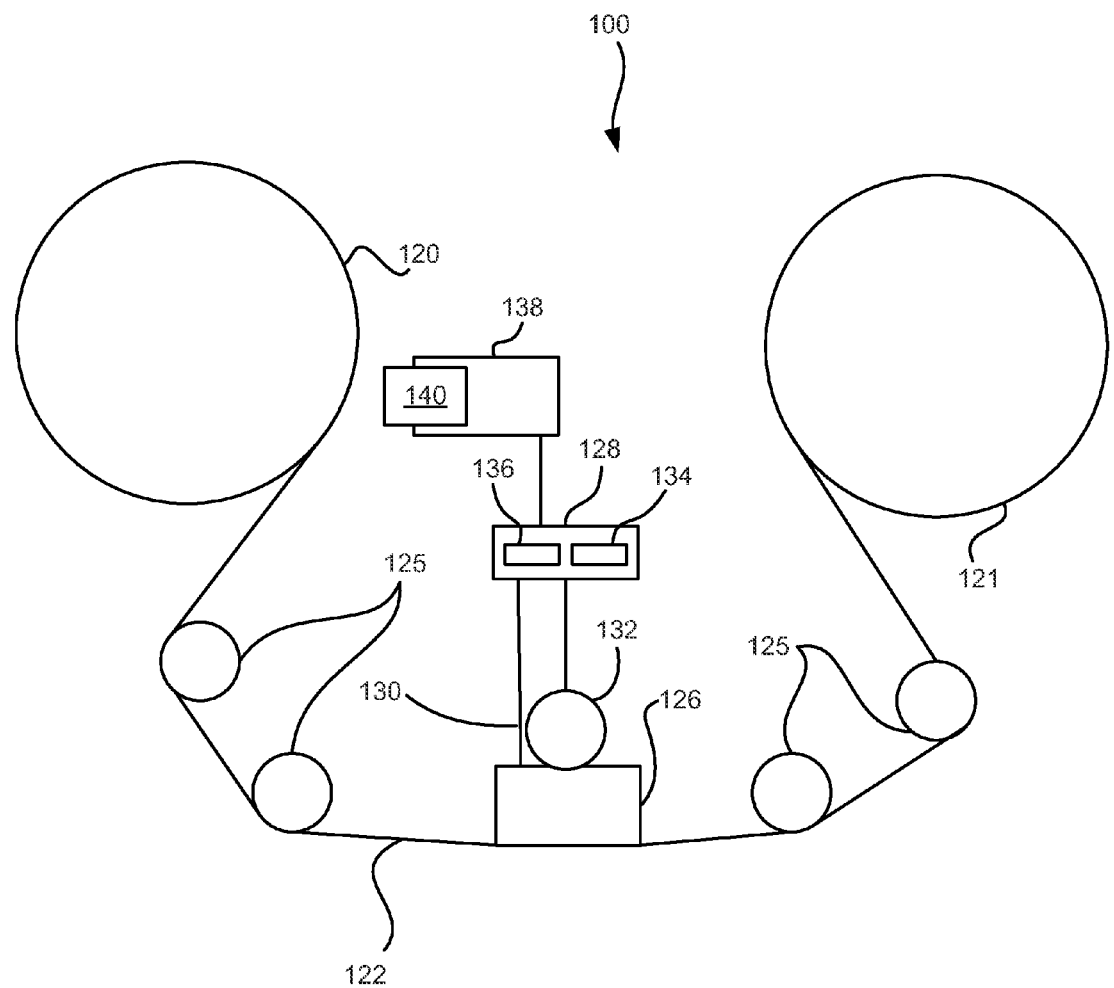
FIG. 1B illustrates a simplified tape drive of a tape-based data storage system, according to one embodiment.

FIG. 1B illustrates a simplified tape drive 100 of a tape-based data storage system, which may be employed according to various embodiments. While one specific implementation of a tape drive is shown in FIG. 1B, it should be noted that the embodiments described herein may be implemented in the context of any type of tape drive system. As shown, a tape supply cartridge 120 and a take-up reel 121 are provided to support a tape 122. One or more of the reels may form part of a removable cassette and are not necessarily part of the tape drive 100. The tape drive 101), such as that illustrated in FIG. 1B, may further include drive motor(s) to drive the tape supply cartridge 120 and the take-up reel 121 to move the tape 122 over a tape head 126 of any type.

Guides 125 guide the tape 122 across the tape head 126. Such tape head 126 is in turn coupled to a controller assembly 128 via a cable 130. The controller 128 typically comprises a servo channel 134 and data channel 136 which includes data flow processing. It controls reel motion (not shown in FIG. 1B) and head functions, such as track following, writing, reading, etc. The cable 130 may include read/write circuits to transmit data to the head 126 to be recorded on the tape 122 and to receive data read by the head 126 from the tape 122. An actuator 132 moves the head 126 to a set of tracks on the tape 122 in order to perform a write or a read operation.

In one embodiment, the tape drive 100 may comprise a data buffer 138 which is accessible by the tape drive 100 and the controller 128. This data buffer 138 may be organized as a ring buffer and may be split into one or more portions, with one portion being a reserved data buffer 140, which may also be organized into a ring buffer, to be used for storage of partial data sets during reading operations from the tape 122.

An interface may also be provided for communication between the tape drive 100 and a host (integral or external) to send and receive the data and for controlling the operation of the tape drive 100 and communicating the status of the tape drive 100 to the host; as would be understood by one of skill in the art.

Typically, in order to avoid off-track reading of data from magnetic media, such as a magnetic tape, a read operation is terminated when a valid position error signal (PES) is not available, e.g., an invalid PES is detected. This helps to avoid blind reading data from data tracks different from target data tracks, but it disables the tape drive's capability to recover the data with error correction code (ECC).

There are two types of defects that cause reading errors in conventional reading methods: 1) stopping a read operation at a damaged servo pattern, and 2) ignoring an invalid PES and continuing reading.

Once a servo pattern is damaged, invalid PES is generated and a servo control system will stop the read process. Multiple read retries will be attempted all reread attempts will fail due to the damaged servo pattern. As a result, the tape drive will not be allowed to continue to read remaining data on the magnetic tape. This situation is shown in FIG. 2 according to one exemplary embodiment.

Figure 2:
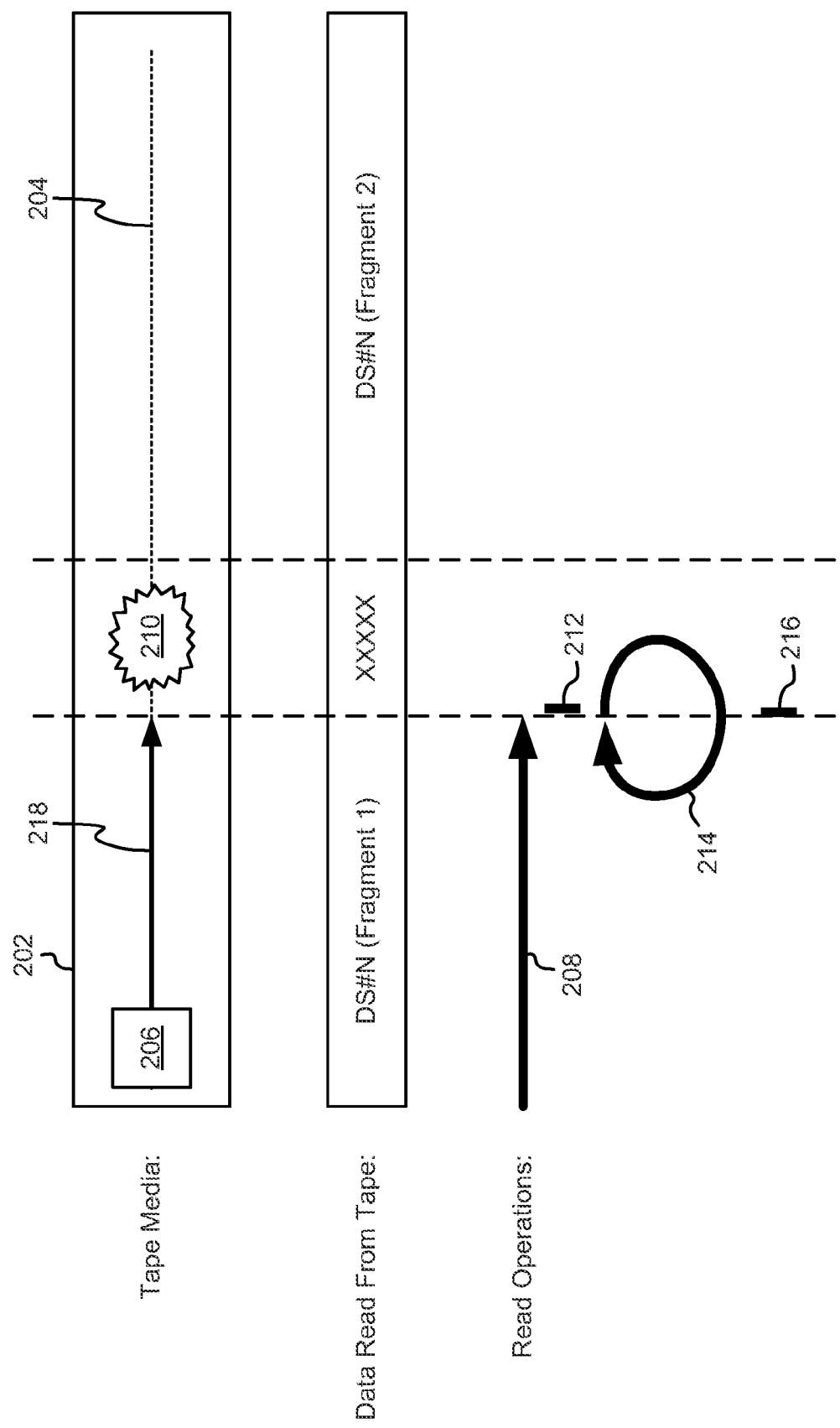
FIG. 2 shows a typical tape read situation.

As shown in FIG. 2, a magnetic head 206 is moved along a target track 204 of a magnetic tape 202, with its path being indicated by a line indicating magnetic head movement 218. The magnetic tape 202 stores a plurality of data sets, which may be the smallest physical units of data written to the magnetic tape 202 and/or capable of being read from the magnetic tape 202. During this read operation 208, a first fragment of a data set, such as fragment 1 of data set N (DS#N), is read and no problems are encountered until a defect 210 in the tape 202. This defect 210 causes an invalid PES, and in response to the invalid PES, read operations are stopped 212 to avoid blind reading the tape 202. At this point, only a first fragment of DS#N has been read. The magnetic head 206 is then repositioned to reread 214 over the defect 210 which again produces unreadable data. Therefore, all read operations are stopped 216 again, and the remaining data on the tape 202 (the second fragment of DS#N) is never even attempted to be read due to the defect 210.

Alternatively, as shown in FIG. 3A according to another exemplary embodiment, the tape drive may ignore the validity or invalidity of the PES and possible misalignment of the magnetic head 206 and continue the read operation over the defect 210. However, in this situation, there is a risk of reading data from data tracks other than target data tracks. This situation is shown in FIGS. 3A-3B according to a couple of exemplary embodiments.

In FIG. 3A, a magnetic head 206 reads DS#N (Fragment 1) until a defect 210 in the tape 202 results in invalid PES, which may or may not cause the magnetic head 206 to veer off-track and read data from a track other than the target track 204, as indicated by the magnetic head movement 218. During this read operation, instead of continuing to read DS#N, the magnetic head 206 reads a different data set stored on the other data track, DS#M. Then, after reading a valid PES, the magnetic head 206 returns to the target track 204 and begins again to read DS#N (Fragment 2). However, there is a missing portion of DS#N where DS#M was being read instead, which results in incorrect data being read, which most likely will result in the data being unrecoverable, even with ECC decoding.

In FIG. 3B, a similar situation is shown where a magnetic head 206 reads DS#N (Fragment 1) until a large lateral tape motion (LTM) 220 results in off-track reading such that data is read data from a track other than the target track 204, as indicated by the magnetic head movement 218. During this read operation, instead of continuing to read DS#N, the magnetic head 206 reads a different data set stored on the other data track, DS#M. Then, after correcting for the LTM 220, the magnetic head 206 returns to the target track 204 and begins again to read DS#N (Fragment 2). However, there is a missing portion of DS#N where DS#M was being read instead, which results in incorrect data being read, which most likely will result in the data being unrecoverable, even with FCC decoding.

The various embodiments described herein provide better methods to overcome invalid PES and possible magnetic head misalignment while reading through media defects on servo patterns and avoiding reading data from non-targeted data tracks.

In one embodiment, data may be read from magnetic media in a manner which avoids off-track reading and skips media defect areas while screening data sets. This is accomplished, in one approach, by monitoring the PES value and a status of the PES (either valid or invalid). When screening the data set, an error data stream is injected in portions of the data stream as a replacement for the actual data therein at an ECC decoder input in case the PES valid status and PES value indicate that a magnetic head used to read the data is not on the target track. This approach allows for non-stop ECC decoding processing and maximizes usage of error correction once the magnetic head position is back on the target track. For insurance of data integrity, in one embodiment, data may be masked out on both off-track reading areas and media defect areas.

In FIG. 4A, a magnetic head 206 reads DS#N (Fragment 1) until a defect 210 in the tape 202 results in invalid PES, which may or may not cause the magnetic head 206 to veer off-track and read data from a track other than the target track 204, as indicated by the magnetic head movement 218. During this read operation, instead of continuing to read data from the magnetic tape 202, error is injected in place of any data read by the magnetic head 206, according to one embodiment. Then, after reading a valid PES (because the magnetic head 206 has progressed past the defect 210, returned to the target track 204, etc.), the magnetic head 206 begins again to read DS#N (Fragment 2). However, there is a missing portion of DS#N where the error was injected (indicated as a '1' but either bit value may be used to indicate error injection, '0' or '1'), which results in an incomplete data set. However, after ECC decoding, which is possible because the remaining portion of DS#N was read (Fragment #2), it is possible that the entire data set may be recovered, and therefore no repeated reading is required.

In FIG. 4B, a similar situation is shown where a magnetic head 206 reads DS#N (Fragment 1) until a large lateral tape motion (LTM) 220 results in the magnetic head 206 being pushed off-track, as indicated by the magnetic head movement 218. Instead of storing the data read by the magnetic head 206 during oft-track reading, error is injected in place of any data read by the magnetic head 206, according to one embodiment. Then, after correcting for the LTM 220, the magnetic head 206 returns to the target track 204 and begins again to read DS#N (Fragment 2). However, there is a missing portion of DS#N where the error was injected (indicated as a '1' but either bit value may be used to indicate error injection, '0' or '1'), which results in an incomplete data set. However, after ECC decoding, which is possible because the remaining portion of DS#N was read (Fragment #2), it is possible that the entire data set may be recovered, and therefore no repeated reading is required.

It is preferred to inject error when PES is invalid or indicates off-track reading instead of simply stopping reading. This is because skipping a medium defect or off-track reading by stopping the read operation will also result in error correction being adversely affected. Although stopping the entire read operation prevents reading wrong data from a non-target track, and when there is large medium defect followed by a clean area to read a whole data set, there is no difference between embodiments described herein and stopping the read operation entirely, there is a situation where stopping reading is harmful. Specifically, by stopping the read operation, the chance to recover the data set using ECC is lost. When small size defects are scattered on the medium, it causes a bunch of data fragments while writing the data. Then, when reading the data, error recovery is hampered by not reading all of the fragments after restart with ECC. It does not collect and combine the fragments to reconstruct the data. On the other hand, the proposed methods using error injection solve the situation since read RLL decoder and ECC decoder are allowed to keep on running even while the servo is indicated as not being ready. As a result, this feature would combine fragments of data and the data is able to be read back after reconstruction.

Figure 5:
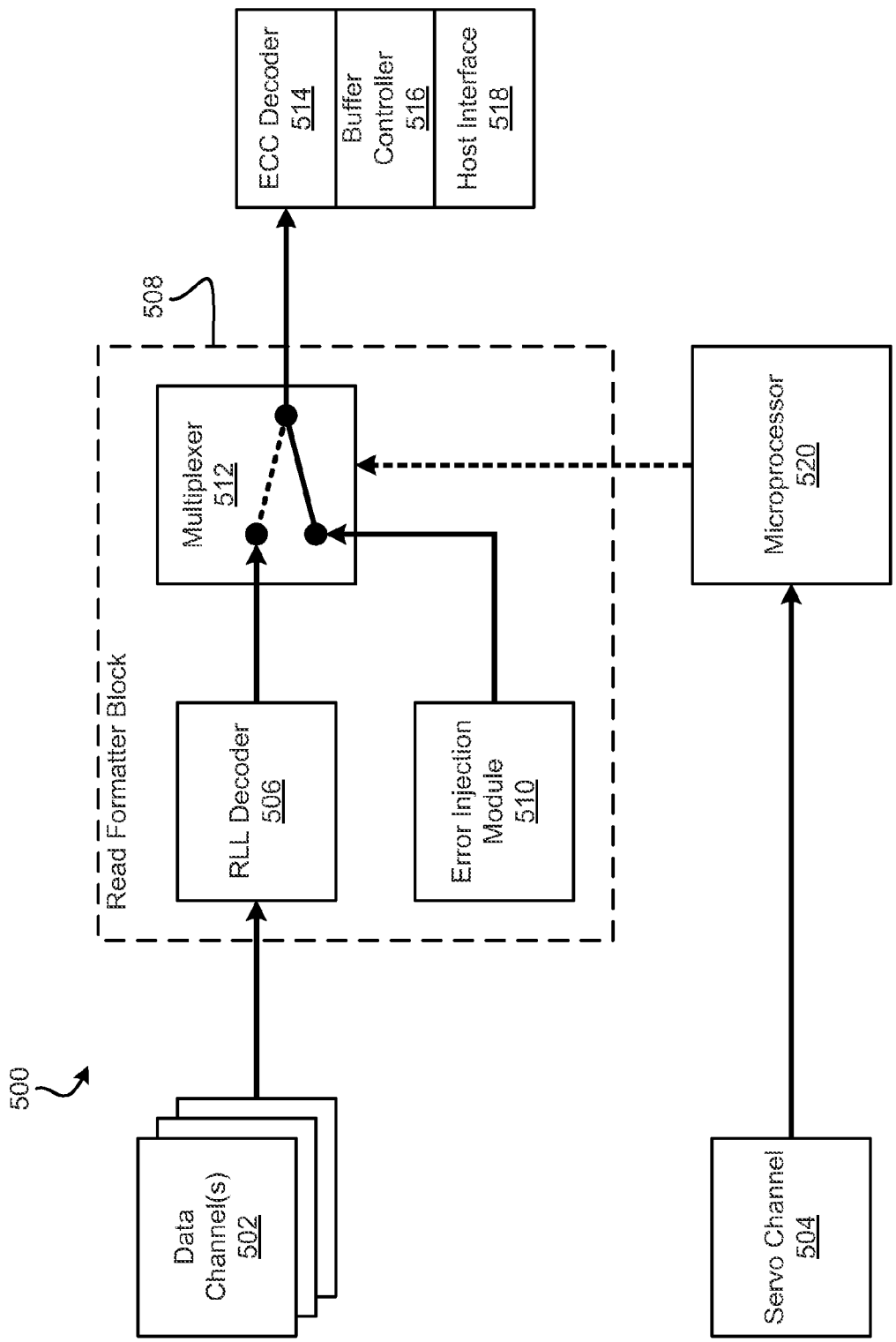
FIG. 5 shows a block diagram of a system, according to one embodiment.

Now referring to FIG. 5, a system 500 is shown according to one embodiment. The system 500 may include at least one data channel 502 and at least one servo channel 504. During normal read processing, the data channel 502 passes data from the magnetic medium (such as a magnetic tape) to a run-length limited (RLL) decoder 506 (or some other type of decoder known in the art). A read formatter block 508 comprises the RLL decoder 506, an error injection module 510, and a multiplexer 512. The RLL decoder 506 demodulates data from a data stream and outputs it into an ECC decoder 514. The ECC decoder 514 is configured to perform ECC decoding on the data stream, then pass the decoded data to a buffer controller 516 for placement in a buffer queue, followed by transmission by a host interface block 518 to a connected host.

In parallel with normal read processing, microcode, or some other type of computer readable instructions known in the art, integrated with and/or accessible by a microprocessor 520, is executed to monitor PES values and validity. In one embodiment, this is performed by checking an output from one or more of the servo channels 504. Once the microprocessor 520 detects PES invalid and/or magnetic head position being off-track (e.g., not on-track), the microprocessor 520, via instruction in the microcode, switches the multiplexer 512 to receive a signal from the error injection module 510, instead of from the RLL decoder 506 as is normal in a read operation.

The error injection module 510 generates an error bit stream which includes all the same bits (e.g., either '1' or '0', depending on which bit indicates an error being detected. This forces the ECC decoder 514 to refrain from decoding data read from a non-target track. After the PES status returns to valid and the magnetic head is no longer off-track (e.g., it is on-track), the microprocessor 520, via instruction in the microcode, controls the multiplexer 512 to return back to receiving and sending the data stream received from the RLL decoder 506, as in a normal read operation.

In order to control the various components described in system 500, microcode may be implemented in one or more of the components and/or one or more processors in the system 500, such as the microprocessor 520. The microcode may be executed on the microprocessor 520 on a real time basis, such as every 20 μs, 30 μs, 40 μs, 50 μs, 60 μs, etc.

Figure 6:
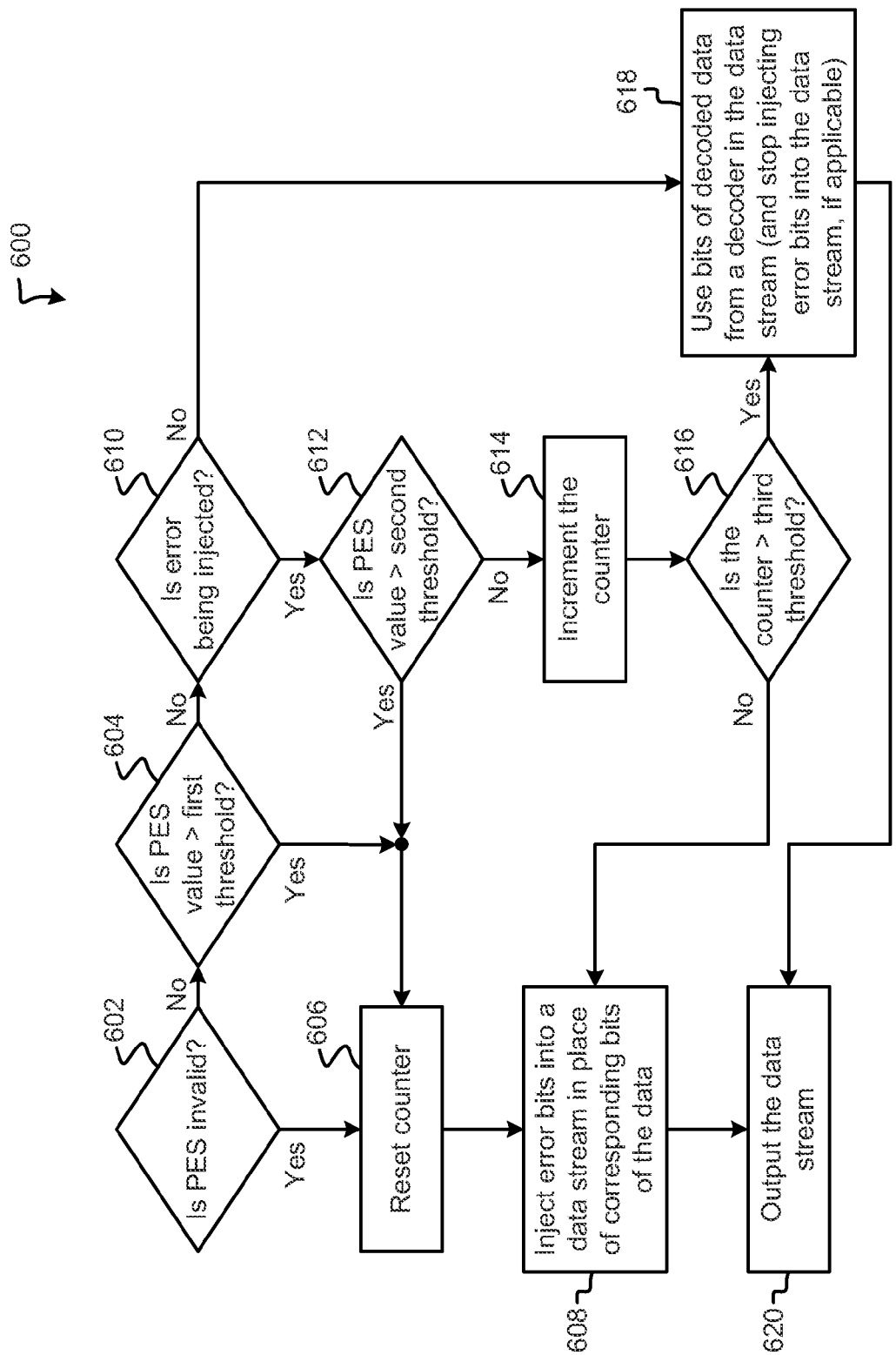
FIG. 6 is a flowchart of a method according to one embodiment.

Now referring to FIG. 6, a flowchart of a method 600 for processing data is shown according to one embodiment. The method 600 may be performed in accordance with the present invention in any of the environments depicted in FIGS. 1A-5, among others, in various embodiments. Of course, more or less operations than those specifically described in FIG. 6 may be included in method 600, as would be understood by one of skill in the art upon reading the present descriptions.

Each of the steps of the method 600 may be performed by any suitable component of the operating environment. For example, in various embodiments, the method 600 may be partially or entirely performed by a magnetic tape drive, tape drive controller, or some other device having one or more processors therein. The processor, e.g., processing circuit(s), chip(s), and/or module(s) implemented in hardware and/or software, and preferably having at least one hardware component may be utilized in any device to perform one or more steps of the method 600. Illustrative processors include, but are not limited to, a central processing unit (CPU), an application specific integrated circuit (ASIC), a switching ASIC, a field programmable gate array (FPGA), etc., combinations thereof, or any other suitable computing device known in the art.

As shown in FIG. 6, method 600 may initiate with operation 602, where it is determined whether a PES is invalid while reading data from a magnetic medium using at least one data channel. When the PES is invalid, method 600 continues to operation 606; otherwise, method 600 continues to operation 604.

According to one embodiment, the PES (along with a PES value) may be received from and/or read through a servo channel of a magnetic medium drive, reading device, etc., such as a tape drive, HDD, optical drive, etc. Certain aspects of the method 600 may change depending on what type of magnetic data storage medium is being read and having data thereof processed, but the overall scheme translates across many different media platforms.

In another embodiment, the data may be received from and/or read through the at least one data channel, either by the magnetic medium drive or some other system configured for such data reading.

Method 600 may be repeated periodically in order to track, in real time, the validity of the PES over the course of reading data from a magnetic medium, in one embodiment. Furthermore, validity of the PES may be determined periodically (such as every 20 µs, 30 µs, 40 µs, 50 µs, 60 µs, etc.) while reading the data from the magnetic medium using the at least one data channel, according to another embodiment.

In operation 604, it is determined whether a PES value is above a first predetermined threshold when the PES is valid, which indicates that a magnetic head used to read data from the magnetic medium is off-track. Again, the PES value may be received from and/or read through the servo channel of a magnetic medium drive. When the PES value is above the first predetermined threshold, method 600 continues to operation 606; otherwise, method 600 continues to operation 610.

The first predetermined threshold may be based at least partially on track pitch for the magnetic medium used to store the data. For example, when using a 32-track magnetic tape, the first predetermined threshold may be selected to be in a range from about 3.5 µm to about 10 µm, such as about 5 µm.

In operation 606, a counter is reset. The counter is configured for tracking a number of times that data has been read from the magnetic medium without utilizing the error injection described in operation 608. Resetting the counter may put the counter back to zero, or some other starting numeric value from which counting is to begin anew.

In operation 608, error bits are injected into a data stream in place of corresponding bits of decoded data from a decoder. This occurs whenever the PES is invalid and/or the PES value is above the first predetermined threshold, as determined previously in operations 602 and 604, respectively. According to one embodiment, this may be considered placing the magnetic medium drive into error injection mode so that error bits are injected into the data stream whenever the magnetic head is off-track or the PES is invalid instead of using the data read from the magnetic medium (which may be decoded).

In one embodiment, the error bits may be injected into the data stream in place of corresponding bits of the decoded data using a multiplexer, the multiplexer being configured to produce the data stream by selectively choosing an error bit from an error injection module or a bit of decoded data from a decoder, such as a RLL decoder or some other suitable decoder of a type known in the art.

After injecting error into the data stream, the data stream is output in operation 620.

In operation 610, it is determined whether error is already being injected into the data stream, as described in operation 608, such as due to being in the error injection mode prior to this iteration of method 600. This decision is made when the PES value is not above the first predetermined threshold, as described in operation 604. When error is being injected, method 600 continues to operation 612; otherwise, method 600 continues to operation 618 to utilize the decoded data from the decoder for the data stream instead of injected error.

In this way, according to method 600, each bit in the data stream is selected from either injected error or the decoder, with the bit being selected from an error injection module when the PES is invalid and/or the PES value is above the first predetermined threshold, and the bit being selected from the decoder when the PES is valid and the PES value is not above the first predetermined threshold.

In operation 612, it is determined whether the PES value is above a second predetermined threshold. This determination is made when error is being injected into the data stream and the PES value is not above the first predetermined threshold, as determined in operations 610 and 604, respectively, described previously. When the PES value is above the second predetermined threshold, method 600 returns to operation 606 to reset the counter; otherwise, method 600 continues to operation 614 to increment the counter.

The second predetermined threshold may be based at least partially on track pitch for the magnetic medium used to store the data. For example, when using a 32-track magnetic tape, the second predetermined threshold may be selected to be in a range from about 0.5 µm to about 2 µm, such as about 1 µm.

In operation 614, the counter is incremented. When the counter is based on single numeric values, it may be incremented by one. Of course, any number may be added to the counter, as long as the overall scheme is understood as to when the counter may be greater than a third predetermined threshold, as described below.

In operation 616, it is determined whether the counter is above the third predetermined threshold. This determination is made when the PES value is not above the second predetermined threshold, as determined previously in operation 612. When the counter is above the third predetermined threshold, method 600 continues to operation 618 to utilize decoded data in the data stream; otherwise, method 600 returns to operation 608 to utilize error injection in the data stream.

The third predetermined threshold may be any numeric value which is determined to indicate that the magnetic medium is going to be on-track and will not be off-track in the near future, as indicated by a number of on-track reads, the number totaling the third predetermined threshold for the counter to exceed. For example, the third predetermined threshold may be in a range from about 20 to about 200, such as about 100. In this embodiment, 100 PES validity checks during on-track reads must be made before error stops being injected into the data stream.

In operation 618, bits of decoded data from the decoder are used in the data stream instead of error bits. Furthermore, if error bits had previously been used, this error injection into the data stream is stopped. Operation 618 is performed when the counter is above the third predetermined threshold, indicating on-track reading and/or when error injection mode is not set in the magnetic medium drive.

In a further embodiment, the data read from the magnetic medium may be decoded using a RLL decoder to produce the decoded data. However, any suitable decoder known in the art may be used.

In operation 620, the data stream is output, such as by transmitting it to another component of the magnetic medium drive, decoding the data again to further correct errors therein, etc.

In another embodiment, an ECC decoder may further decode the data stream after being output. The ECC decoder may be configured to utilize ECC to correct remaining errors (including injected errors) in the data stream (which may include a mix of decoded data and injected error).

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only Memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. By integrated with, what is meant is that the processor has logic embedded therewith as hardware logic, such as an ASIC, a FPGA, etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a CPU, an integrated circuit (IC), a graphics processing unit (GPU), etc.

It will be clear that the various features of the foregoing systems and/or methodologies may be combined in any way, creating a plurality of combinations from the descriptions presented above.

It will be further appreciated that embodiments of the present invention may be provided in the form of a service deployed on behalf of a customer to offer service on demand.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A system for processing data, the system comprising a controller configured to:
   determine whether a position error signal (PES) is invalid while reading data from a magnetic medium using at least one data channel;
   determine whether a PES value is above a first predetermined threshold in response to a determination that the PES is valid; and
   inject error bits into a data stream in place of corresponding bits of decoded data in response to a determination that the PES is invalid and in response to a determination that the PES value is above the first predetermined threshold, wherein the error bits are injected into the data stream in place of corresponding bits of the decoded data using a multiplexer, the multiplexer being configured to produce the data stream by selectively choosing an error bit from an error injection module or a bit of the decoded data from a decoder,
   wherein the error bit is selected from the error injection module in response to the determination that the PES is invalid and in response to the determination that the PES value is above the first predetermined threshold, and
   wherein the bit is selected from the decoder in response to the determinations that the PES is valid and the PES value is not above the first predetermined threshold.

2. The system as recited in claim 1, wherein the controller is further configured to:
   read the data from the magnetic medium using the at least one data channel; and
   receive the PES and PES value from a servo channel.

3. The system as recited in claim 1, wherein the controller is further configured to:
   decode the data using a run-length limited (RLL) decoder to produce the decoded data based on the data from the magnetic medium; and
   output the data stream.

4. The system as recited in claim 1, wherein the controller is further configured to decode the data stream using an error correction code (ECC) decoder to further correct remaining errors in the data stream, and wherein validity of the PES is determined periodically while reading the data from the magnetic medium using the at least one data channel.

5. The system as recited in claim 1, wherein the controller is further configured to determine whether error is already being injected into the data stream in response to a determination that the PES value is not above the first predetermined threshold.

6. The system as recited in claim 5, wherein the controller is further configured to:
   determine whether the PES value is above a second predetermined threshold in response to determinations that error is being injected into the data stream and the PES value is not above the first predetermined threshold;
   increment a counter and determine whether the counter is above a third predetermined threshold in response to a determination that the PES value is not above the second predetermined threshold;
   utilize the decoded data for the data stream and stop injecting error into the data stream in response to a determination that the counter is above a third predetermined threshold after incrementing the counter;
   reset the counter in response to a determination that the PES value is above the second predetermined threshold and inject error bits into the data stream in place of corresponding bits of the decoded data; and
   inject error bits into the data stream in place of corresponding bits of the decoded data in response to determinations that the PES value is not above the second predetermined threshold and the counter is not above the third predetermined threshold.

7. A magnetic tape drive, comprising a controller configured to:
   read data from a magnetic medium using at least one data channel;
   receive a position error signal (PES) and a PES value from a servo channel;
   determine whether the PES is invalid while reading the data;
   determine whether the PES value is above a first predetermined threshold when the PES is valid; and
   inject error bits into a data stream in place of corresponding bits of decoded data when the PES is invalid and/or the PES value is above the first predetermined threshold, wherein the error bits are injected into the data stream in place of corresponding bits of the decoded data using a multiplexer, the multiplexer being configured to produce the data stream by selectively choosing an error bit from an error injection module or a bit of the decoded data from a decoder,
   wherein the error bit is selected from the error injection module when the PES is invalid and/or the PES value is above the first predetermined threshold, and
   wherein the bit is selected from the decoder when the PES is valid and the PES value is not above the first predetermined threshold.

8. The magnetic tape drive as recited in claim 7, wherein the controller is further configured to:
   decode the data stream using a run-length limited (RLL) decoder to produce the decoded data based on the data from the magnetic medium; and
   output the data stream.

9. The magnetic tape drive as recited in claim 7, wherein the controller is further configured to decode the data stream using an error correction code (ECC) decoder to further correct remaining errors in the data stream, and wherein validity of the PES is determined periodically while reading the data from the magnetic medium using the at least one data channel.

10. The magnetic tape drive as recited in claim 7, wherein the controller is further configured to determine whether error is already being injected into the data stream in response to a determination that the PES value is not above the first predetermined threshold.

11. The magnetic tape drive as recited in claim 10, wherein the controller is further configured to:
   determine whether the PES value is above a second predetermined threshold when error is being injected into the data stream and the PES value is not above the first predetermined threshold;
   increment a counter and determine whether the counter is above a third predetermined threshold when the PES value is not above the second predetermined threshold;
   utilize the decoded data for the data stream and stop injecting error into the data stream when the counter is above the third predetermined threshold after incrementing the counter;
   reset the counter when the PES value is above the second predetermined threshold and inject error bits into the data stream in place of corresponding bits of the decoded data; and
   inject error bits into the data stream in place of corresponding bits of the decoded data when the PES value is not above the second predetermined threshold and the counter is not above the third predetermined threshold.

12. A method for processing data, the method comprising:
   determining whether a position error signal (PES) is invalid while reading data from a magnetic medium using at least one data channel;
   determining whether a PES value is above a first predetermined threshold when the PES is valid;
   injecting error bits into a data stream in place of corresponding bits of decoded data when the PES is invalid and/or the PES value is above the first predetermined threshold, wherein the error bits are injected into the data stream in place of corresponding bits of the decoded data using a multiplexer, the multiplexer being configured to produce the data stream by selectively choosing an error bit from an error injection module or a bit of the decoded data from a decoder, wherein the error bit is selected from the error injection module when the PES is invalid and/or the PES value is above the first predetermined threshold, and wherein the bit is selected from the decoder when the PES is valid and the PES value is not above the first predetermined threshold;
   decoding the data using a run-length limited (RLL) decoder to produce the decoded data based on the data from the magnetic medium; and
   outputting the data stream.

13. The method as recited in claim 12, further comprising:
   read the data from the magnetic medium using the at least one data channel; and
   receiving the PES and PES value from a servo channel.

14. The method as recited in claim 12, further comprising decoding the data stream using an error correction code (ECC) decoder to further correct remaining errors in the data stream, and wherein validity of the PES is determined periodically while reading the data from the magnetic medium using the at least one data channel.

15. The method as recited in claim 12, further comprising determining whether error is already being injected into the data stream when the PES value is not above the first predetermined threshold.

16. The method as recited in claim 15, further comprising:
   determining whether the PES value is above a second predetermined threshold when error is being injected into the data stream and the PES value is not above the first predetermined threshold;
   incrementing a counter and determine whether the counter is above a third predetermined threshold when the PES value is not above the second predetermined threshold;
   utilizing the decoded data for the data stream and stop injecting error into the data stream when the counter is above the third predetermined threshold after incrementing the counter;
   resetting the counter when the PES value is above the second predetermined threshold and inject error bits into the data stream in place of corresponding bits of the decoded data; and
   inject error bits into the data stream in place of corresponding bits of the decoded data when the PES value is not above the second predetermined threshold and the counter is not above the third predetermined threshold.

17. A system for processing data, the system comprising a controller configured to:
   determine whether a position error signal (PES) is invalid while reading data from a magnetic medium using at least one data channel;
   determine whether a PES value is above a first predetermined threshold in response to a determination that the PES is valid;
   inject error bits into a data stream in place of corresponding bits of decoded data in response to a determination that the PES is invalid and in response to a determination that the PES value is above the first predetermined threshold;
   determine whether error is already being injected into the data stream in response to a determination that the PES value is not above the first predetermined threshold;
   determine whether the PES value is above a second predetermined threshold in response to determinations that error is being injected into the data stream and the PES value is not above the first predetermined threshold;
   increment a counter and determine whether the counter is above a third predetermined threshold in response to a determination that the PES value is not above the second predetermined threshold;
   utilize the decoded data for the data stream and stop injecting error into the data stream in response to a determination that the counter is above the third predetermined threshold after incrementing the counter;
   reset the counter in response to a determination that the PES value is above the second predetermined threshold and inject error bits into the data stream in place of corresponding bits of the decoded data; and
   inject error bits into the data stream in place of corresponding bits of the decoded data in response to determinations that the PES value is not above the second predetermined threshold and the counter is not above the third predetermined threshold.

18. A magnetic tape drive, comprising a controller configured to:
   read data from a magnetic medium using at least one data channel;
   receive a position error signal (PES) and a PES value from a servo channel;
   determine whether the PES is invalid while reading the data;

determine whether the PES value is above a first predetermined threshold when the PES is valid;
inject error bits into a data stream in place of corresponding bits of decoded data when the PES is invalid and/or the PES value is above the first predetermined threshold;
determine whether error is already being injected into the data stream in response to a determination that the PES value is not above the first predetermined threshold;
determine whether the PES value is above a second predetermined threshold when error is being injected into the data stream and the PES value is not above the first predetermined threshold;
increment a counter and determine whether the counter is above a third predetermined threshold when the PES value is not above the second predetermined threshold;
utilize the decoded data for the data stream and stop injecting error into the data stream when the counter is above the third predetermined threshold after incrementing the counter;
reset the counter when the PES value is above the second predetermined threshold and inject error bits into the data stream in place of corresponding bits of the decoded data; and
inject error bits into the data stream in place of corresponding bits of the decoded data when the PES value is not above the second predetermined threshold and the counter is not above the third predetermined threshold.

19. A method for processing data, the method comprising:
determining whether a position error signal (PES) is invalid while reading data from a magnetic medium using at least one data channel;
determining whether a PES value is above a first predetermined threshold when the PES is valid;
injecting error bits into a data stream in place of corresponding bits of decoded data when the PES is invalid and/or the PES value is above the first predetermined threshold;
determining whether error is already being injected into the data stream when the PES value is not above the first predetermined threshold;
determining whether the PES value is above a second predetermined threshold when error is being injected into the data stream and the PES value is not above the first predetermined threshold;
incrementing a counter and determine whether the counter is above a third predetermined threshold when the PES value is not above the second predetermined threshold;
utilizing the decoded data for the data stream and stop injecting error into the data stream when the counter is above the third predetermined threshold after incrementing the counter;
resetting the counter when the PES value is above the second predetermined threshold and inject error bits into the data stream in place of corresponding bits of the decoded data;
inject error bits into the data stream in place of corresponding bits of the decoded data when the PES value is not above the second predetermined threshold and the counter is not above the third predetermined threshold;
decoding the data using a run-length limited (RLL) decoder to produce the decoded data based on the data from the magnetic medium; and
outputting the data stream.

* * * * *